United States Patent [19]
Choi

[11] Patent Number: 4,989,243
[45] Date of Patent: Jan. 29, 1991

[54] AUTOMATIC COMPENSATION SYSTEM OF TRANSMISSION LEVEL IN MODEM

[75] Inventor: Choon-Kun Choi, Sungnam, Rep. of Korea

[73] Assignee: SamSung Electronics Co., Ltd., Suweon, Rep. of Korea

[21] Appl. No.: 292,355

[22] Filed: Dec. 30, 1988

[30] Foreign Application Priority Data

Oct. 14, 1988 [KR] Rep. of Korea ............... 1988-13425

[51] Int. Cl.$^5$ .............................................. H04B 3/10
[52] U.S. Cl. .................................. 379/402; 370/32.1; 379/399
[58] Field of Search ............... 455/69, 8, 116; 370/32, 370/32.1; 379/406, 410, 411, 402, 400, 401, 403, 404

[56] References Cited

U.S. PATENT DOCUMENTS

| | | | |
|---|---|---|---|
| 4,246,582 | 1/1981 | Kondo et al. ..................... | 370/32 |
| 4,811,421 | 3/1989 | Havel et al. ..................... | 455/69 |

FOREIGN PATENT DOCUMENTS

| | | | |
|---|---|---|---|
| 0113231 | 7/1984 | European Pat. Off. ............ | 370/32 |
| 2485842 | 12/1981 | France ............................ | 370/32 |
| 0016431 | 1/1984 | Japan ............................. | 370/32 |
| 0018826 | 1/1988 | Japan ............................. | 375/8 |

OTHER PUBLICATIONS

Electronic Dictionary, McGraw-Hill Book Company, Nelson M. Cooke et al.
Electrical and Electronic Engineering, McGraw-Hill Dictionary, S. P. Parker.
Reference Data for Radio Engineers, Howard W. Sams & Co., Inc., ITT.
Electronics in Engineering, Ryland Hill, M.S., E.E., McGraw-Hill Book Co.

Primary Examiner—James L. Dwyer
Attorney, Agent, or Firm—Robert E. Bushnell

[57] ABSTRACT

A system for automatically compensating the transmitting (outgoing) signal level by detecting the receiving (incoming) signal level received from a communication channel to MODEM. Said system includes a gain controller for controlling the output gain of the analog signal received from analog signal input terminal in accordance with gain control data, hybrid means for amplifying the output of said gain controller, providing the amplified signal to transmit to a telephone line, and amplifying the analog signal received from the telephone line, receiving level sensing means for providing a plurality of receiving information data, said receiving information data teaching the level of the received signal, and a microprocessor unit for outputting the gain control data to said gain controller in response to the receiving information data and initial gain control data stored therein. The gain control data increases or decreases according to the receiving information data provided to the microprocessor, if the level of the receiving signal to the MODEM is too high or too low, thereby controlling its transmitting gain with an optimum level according to the receiving level.

20 Claims, 2 Drawing Sheets

AUTOMATIC COMPENSATION SYSTEM OF TRANSMISSION LEVEL IN MODEM

BACKGROUND OF THE INVENTION

The present invention relates to an automatic compensation system for use in MODEM, and in particular to a system for automatically compensating the transmitting (outgoing) signal level by detecting the receiving (incoming) signal level from a communication channel.

Generally, in performing data communication between remote places by connecting a communication system such as MODEM to a public switching telephone network (PSTN), a data access arrangement (DAA) that meets a predetermined standard should be used therein. Thus, a MODEM for executing the data communication via the public switching telephone network should be operated with the transmitting level of CCITT regulation or Bell regulation. The CCITT or Bell regulation recommends to transmit with the signal level of $-10$ dBm $\pm 1$ dBm, considering therein the gain attenuation ($-33$ dBm) in transmission lines, while it recommends that the receiving side of the MODEM should receive and demodulate a receiving signal having the gain level of at least $-43$ dBm.

In most existing MODEMs, the transmitting gain thereof is usually fixed to a constant value of the transmitting gain of $-10$ dBm $\pm 1$ dBm considering only the gain attenuation ($-33$ dBm) of transmission line on which data is transmitted. However, in a MODEM that transmits data to the public switching telephone network by setting its transmitting gain to $-10$dBm$\pm$1dBm as aforementioned, the following problems arise. That is to say, there has been a problem that the possibilities of the interference of data and the transmitting and receiving error occurrence are considerably high, because the factors resulting from the increase or decrease of the gain attenuation of the transmission line have been not taken into account. Inevitably, the gain attenuation of a transmission line increases or decreases depending upon the variation of line conditions according to the weather and environment, and the difference of local conditions of the public switching telephone line according to the area. Therefore, a problem can be rendered that the data is not exactly received at a remote side MODEM, according to the extent of gain attenuation in the public switching telephone trasmission line, if the transmitting gain is always set with a constant level.

OBJECT OF THE INVENTION

Therefore, an object of the present invention is to provide an improved automatic compensation system in which, when data is transmitted via the transmission line of a public switching telephone network at a predetermined level, the level of data signal received can be detected and the gain attenuation of the transmission line according to the detected level can be compensated automatically, so that the data transmission is achieved without error.

Another object of the present invention is to provide a system for detecting the receiving level of a data signal being transmitted through the transmission line.

These and other objects are attained with a system for automatically compensating the transmitting (outgoing) signal level by detecting the receiving (incoming) signal level received from a communication channel to MODEM. Said system includes a gain controller for controlling the output gain of the analog signal received from analog signal input terminal in accordance with gain control data, hybrid means for amplifying the output of said gain controller, providing the amplified signal to transmit to a telephone line, and amplifying the analog signal received from the telephone line, receiving level sensing means for providing a plurality of receiving information data, said receiving information data teaching the level of the received signal, and a microprocessor unit for outputting the gain control data to said gain controller in response to the receiving information data and initial gain control data stored therein. The gain control data increases or decreases according to the receiving information data provided to the microprocessor, if the level of the receiving signal to the MODEM is too high or too low, thereby controlling its transmitting gain with an optimum level according to the receiving level.

DETAILED DESCRIPTION OF THE INVENTION

The preferred embodiment of the present invention will be explained in detail with reference to the accompanying drawings, hereinafter.

Figure 1:
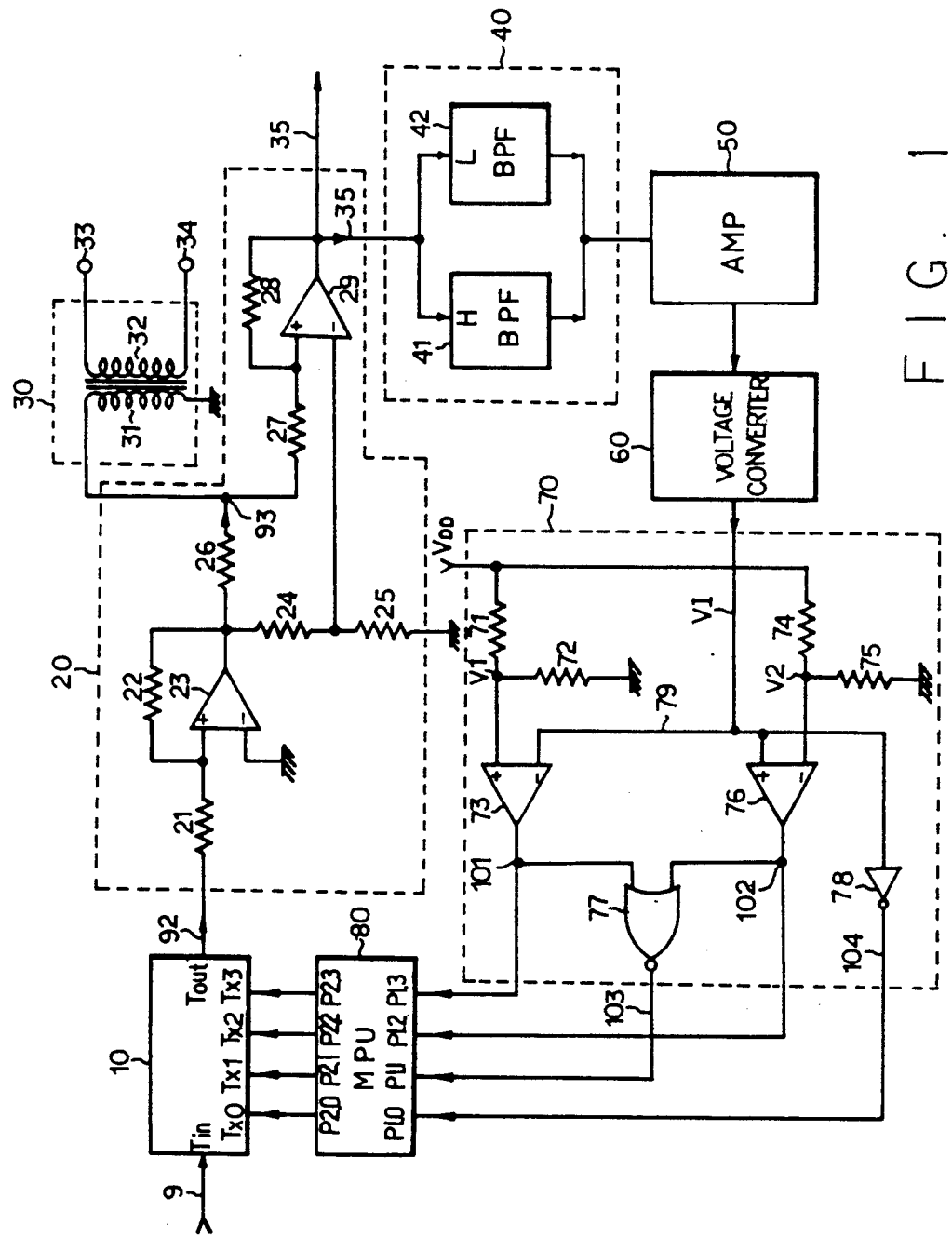
FIG. 1 is a schematic circuit diagram of a preferred embodiment according to the present invention.

FIG. 1, a circuit diagram of a preferred embodiment of the automatic compensation system of the present invention, includes:

an analog input terminal 9 and an analog output terminal 35;

connecting terminals 33, 34 of a telephone line;

a transformer 30 having a first coil 32 with both ends being connected to the connecting terminals 33, 34 of said telephone line, and a second coil 31 having one end being grounded and other end inducing the input signal to said first coil 32, for matching the signal impedance of said first and second coils 32, 33;

a gain controller 10 for controlling the gain of a signal received from said analog signal input terminal 9 in accordance with input of gain control data;

an operational amplifier 23 wherein the output of said gain controller 10 is applied to a non-inverting terminal (+) through a resistor 21 for performing a non-inverted amplification by a feedback resistor 22 connected between the output terminal thereof and the non-inverting terminal, resistors 24, 25 are connected between the output terminal of said operational amplifier 23 and the ground, and a resistor 26 is connected to limit the output of said operational amplifier 23 to a predetermined level prior to delivering said output to one terminal of the second coil 31 of said transformer 30;

an operational amplifier 29 wherein the signal from one terminal of said second coil 31 is applied to a non-inverting terminal (+) through a resistor 27, and a feedback resistor 28 is connected between said non-inverting terminal and the output terminal thereof, the inversion terminal ($-$) thereof being connected to a connecting node between said resistors 24 and 25, said operational amplifiers 23, 29 and resistors 21 to 28 serving as a 2-wire/4-wire hybrid means;

a band-pass filter means 40 including first and second band-pass filters 41, 42 which respectively filter a first band signal and a second band signal from the output of said operational amplifier 29;

an amplifier 50 for amplifying the output of said band-pass filter means;

a voltage converter 60 which rectifies the output from said amplifier 50 and then converts it into a direct-current voltage signal VI;

a data receiving level sensing means 70 including resistors 71, 72 and 74, 75 which are respectively connected in series between a first power source (VDD) and a second power source (GROUND) for respectively supplying a first reference voltage V1 and a second reference voltage V2, a first comparator 73 wherein said first reference voltage V1 is applied to a non-inverting terminal (+) and the output voltage VI of said voltage converter 60 is inputted to an inverting terminal (−), for comparing these two input voltages; a second comparator 76 wherein the voltage VI applied to the inverting terminal (−) of said first comparator 73 is also applied to a non-inverting terminal (+) and the second reference voltage V2 is applied to an inverting terminal (−), for comparing these two input voltages thereto, a NOR gate 77 for performing a NOR operation to the outputs of said first and second comparators 73, 76, and an inverter 78 receiving said output voltage VI, said data receiving level sensing means providing data reception information and receiving level information; and a microcontroller 80 (Micro Processor Unit: MPU) which outputs the gain control data being set initially by a control program to said gain controller 10, and outputs the variable gain control data for constantly maintaining the transmitting gain of said gain controller 10 by analyzing the data reception information and the receiving level information from said data receiving level sensing means 70.

The reference numeral 35 is a line connected with an analog signal receiving terminal of a demodulator (not shown) in a modem, and the numeral 9 is a line connected with an analog signal output of modulator (not shown) in the modem. Here the microcontroller used in the present invention contains ROM and RAM, and at its input and output ports are provided latches, respectively.

Figure 2:
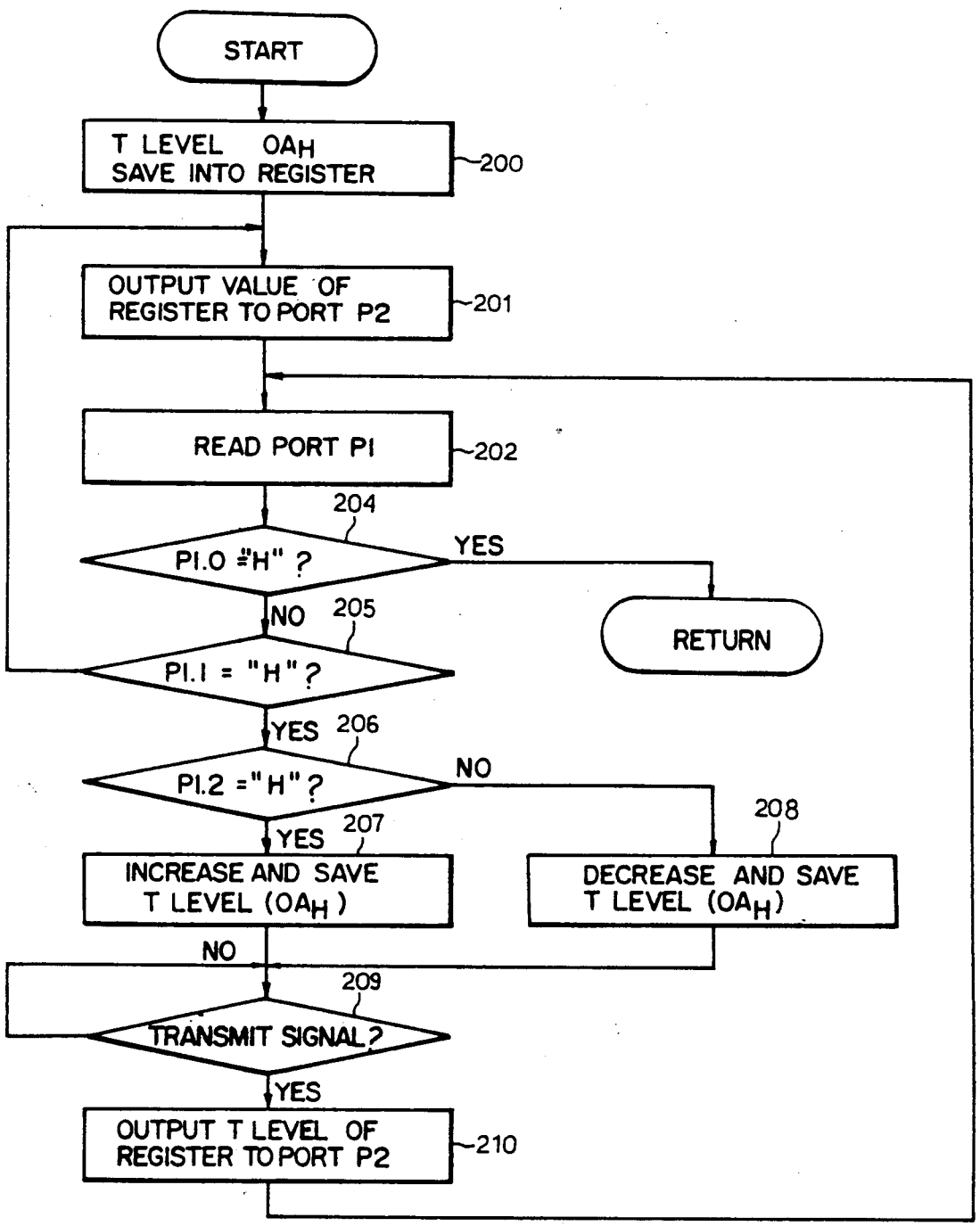
FIG. 2 is a flow chart diagram according to the present invention.

FIG. 2 shows a flow chart diagram according to the present invention, comprising the steps of:

(a) setting an initial gain control data value for setting the initial transmission level (hereinafter called "T level"), storing said value in a register, and providing the data value of said register to an output port;

(b) judging whether the data is received or not by reading the data reception information and the data receiving level information;

(c) selecting the data receiving level information when the result of judging in said step is in a data receiving state, and executing repeatedly said step (a) when it is not in the data receiving state;

(d) outputting the gain control data of said step (a) to the output port when the result of the analysis to the data receiving level information in said step (c) shows normal data receiving level information, and then judging whether the data level is high or low when it shows abnormal data receiving level information; and (e) making the increment or decrement of the initial gain control data in accordance with the result judged in said step (d) and then storing it to the register, and outputting the T level control data of the register to the output port when a predetermined signal is outputted.

An example of the operation of the present invention will be explained in detail with reference to the accompanying drawings, hereinafter.

Now when the power supply voltage is supplied to each circuit of FIG. 1, a MPU 80 sets the gain control data of T level to a hexadecimal value ($0A_H$) at a stage 200 of FIG. 2, and then saves the value in the internal register. Thereafter, the MPU 80 inputs the gain control data ($0A_H$) stored in the register to sending gain variable terminals ($T \times 0$ to $T \times 3$) through the output ports (P2.0 to P2.3) at stage 201. Therefore, said gain controller 10 operates such that the analog transmission signal received via the analog signal input terminal Tin is delivered to said hybrid means with a gain according to the gain control data. At this moment, said gain controller 10 includes 16 steps of variable gain (0 dBm to −15 dBm) in accordance with the received gain control data, and initially controls the input signal with a gain level of −10 dBm provided by the initial gain setting data of MPU 80. When the analog signal is applied on the analog signal input line 9 from the modulator within a MODEM, this is controlled as a gain level of −10 dBm by the operation of the gain controller 10 and then applied on its output line 92.

On the other hand, MPU 80 which executed the stage 201 of said FIG. 2, reads out the port P1 (P1.0 to P1.3), at stage 202, and judges whether or not the input logic of a port P1.0 is "high", at stage 204. At said stage 204, when the input logic is "high", MPU 80 acknowledges that the signal received through the transmission line of public switching telephone network is not present, and then returns to original control sequence.

When an user of an originating MODEM containing therein the circuit of FIG. 1 executes a dialing in order to interconnect with a remote MODEM, said dialing is transmitted to the exchanging system through the network control unit (not shown). Thereby, the exchanging system analyzes said dialing and it then sends a ring signal to the remote MODEM. Then, the remote MODEM which received the ring signal sent from said exchanging system sends back "answer tone 0" indicating the call being accepted in response to the ring signal. At this moment, the "answer tone 0" is transmitted back to the originating MODEM through the public telephone switching network. Therefore, the "answer tone 0" applied to the primary (first) coil 32 of transformer 30 through the terminals 33, 34. The "answer tone 0" of the remote MODEM which is received at the primary (first) coil 32 of said transformer 30 is induced in the secondary (second) coil 31, and the induced signal is applied to a non-inverting terminal (+) of the operational amplifier 29 through a resistor 27. Operational amplifier 29 amplifies the applied signal by a predetemined gain in accordance with the value of a feedback resistor 28, thereby being applied, and change to the analog signal output line 35 of a demodulator, and also being applied to a high-frequency band-pass filter 41 and the low-frequency band-pass filter 42. Here, said high-frequency band-pass filter 41 is for filtering and transmitting the "answer tone 0" sent from the remote MODEM (answer side), while said low-frequency band-pass filter 42, in case of receiving an "answer tone 1" with regard to receiving the answer signal from the originating MODEM, is for filtering and transmitting that. Therefore, the "answer tone 0" with regard to the ring signal received from the remote MODEM is filtered by the high group band-pass filter 41 and then is applied to the amplifier 50.

The amplifier 50, upon receiving the filtered "answer tone 0" amplifies this with a predetermined amplitude and then delivers the amplified answer tone to the voltage converter 60. The voltage converter 60 converts the alternating current from amplifier 50 into the direct current (AC to DC converting), and delivers the converted voltage VI according to its received signal to the inverting input of the first comparator 73, the non-inverting input of the second comparator 76 and inverter 78. The first comparator 73 receives the converted voltage VI of said voltage converter 60 at its inverting input (−) while also receiving at its non-inverting input a first reference voltage V1 divided from the first voltage VDD by the resistance ratio of the resistors 71 and 72 at the connecting node thereof, and thereby compares the levels of these two input signals and produces a resultant output to the output line 101. On the other hand, a second reference voltage V2 is divided and applied to the inverting terminal (−) of second comparator with the second reference voltage V2 being taken from the connecti node of the resistors 74, 75 connected in series with the relation of a predetermined ratio. The second comparator 76 compares the magnitude of two input levels and then produces another resultant output to the output line 102. The levels of said first and second reference voltages V1, V2 are respectively designated with a receiving 'too-high' level and a receiving 'too-low' level by properly setting values of the respective voltage dividing resistors 71, 72 and 74, 75. That is to say, when it is assumed that the gain of a signal received through the transmission line is −43 dBm and it is an optimum receiving state level, it will be enough to set the gain of the first reference voltage V1 with −41 dBm and the gain of the second reference voltage with −45 dBm. This can be utilized to detect the gain of the received analog signal.

Therefore, when the "answer tone 0" from the remote MODEM is rectified to a direct-current voltage at voltage converter 60 and the rectified voltage V1 is produced on the line 79, said first and second comparators 73, 76 each compare the received signals with the predetermined reference voltages and then output the result to input ports (P1.3 and P1.2) of MPU 80. When the output gain of the rectified voltage VI of the voltage converter 60 is −45dBm, the first and second comparators 74, 76 each produce the logic "high" signal. Therefore, the NOR gate 77 inputs a logic "low" signal to the input port P1.1 of MPU 80 through the output line 103, thereby showing that the receiving signal level is in an optimum state being present between the first and second reference voltages V1 and V2.

If the output gain of the rectified voltage VI of the voltage converter 60 is in a state either larger than reference voltage V1 or lower than second reference voltage V2, the NOR gate 77 goes to output "high" signal. And the inverter 78 inverts the rectified voltage of voltage converter 60 and then outputs to the output line 104, thereby inputting to the input port P1.0 of MPU 80. At this moment, the MPU 80 decides that there is a received signal by the operation in the stage 204, and judges, at stage 205, whether the input logic of input port P1.1 is "high" or not, in order to search the level of received signal. At said stage 205, if the output state of NOR gate 77 is logic "low", then MPU 80 decides by its program that the received signal level is in an adequate state, and then repeats the stage 201.

On the other hand, the demodulator (not shown) receiving an input signal through the analog signal output line 35 demodulates the "answer tone 0" for supplying it to a control circuit which controls the transmission and reception of MODEM. At this moment, the control circuit controls the modulator to supply, to the analog signal input line 9, "answer tone 1" indicating the "answer tone 0" being received. Therefore, the signal from the analog signal input line 9 is controlled in the gain controller 10 by the gain according to the gain control data and then the resultant sinal is applied to output line 92. The signal of output line 92 is transmitted to the public telephone line which is the transmission line, through the 2-wire/4-wire hybrid means and the transformer 30.

If the input of input port P1.1 is logic "high" at said stage 205 in FIG. 2, the MPU 80 reads the input logic state of input port P1.2, at stage 206, in order to detect whether a receiving level is the too-high receiving level or too-low receiving level rather than an adequate one. As a result of execution at said stage 206 in FIG. 2, if the input logic state is "high", the MPU 80 judges that the signal level gain is too high, and, at stage 207, increases the T level value ($0A_H$) which is initially set, thereby storing this value in the internal register. Thereafter, the signal supplied through the analog output line 35 is demodulated, and then the MPU 80 judges at stage 209 whether the "answer tone 1" is sent or not in response to this signal. At this moment, the judgement of said stage 209 is easily executed by reshaping the waveform of the output of the modulator applied to analog input line 9. The reason why this stage is executed is that only when the signal will be sent to a remote MODEM with the gain value of T level set previously, the remote MODEM will be able to control the sending level. And the reason why the increment of the gain control data, i.e., the T level value is carried out when the receiving signal is received with a too high gain level, is that the output of gain controller 10 is a negative transmission level.

For example, when the T level value has the initial level value (0A)H, the gain controller 10 controls the output signal gain with −10 dBm and, when the T level value is increased from ($0A_H$) to ($0B_H$), the output of gain controller 10 is produced as the signal gain of −11 dBm. At said stage 209 in FIG. 2, if the modulated analog signal has been transmitted, the MPU 80 outputs the T level value stored in the internal register to the port P2 (P2.0 to P2.3) and then repeats the stage 203. Therefore, the gain of a subsequent signal to be transmitted is controlled and outputted. On the other hand, if the signal inputted at the input port P1.2 is read as "low", at stage 206 in FIG. 2, then MPU 80 decreases the T level value ($0A_H$) which is initially set and then saves it to the register, executing the stage 209, 210.

Therefore, when the receiving signal gain which is transmitted from the remote MODEM is too low, its modulation signal can be transmitted by increasing the transmitting gain. Accordingly, the gain variation according to the condition of transmission line can be detected and therefrom the transmitting level is automatically controlled in response to the detection, thereby having the communication executed with the signal having the optimum gain level irrespectively of the variation of the transmission line condition.

According to the aforementioned embodiment of the present invention, although there has been shown an example which controls the transmitting gain by a hand-shake signal of the MODEM, it will be easily understood by those skilled in the art that the gain of the carrier wave of the signal transmitted from an originating MODEM and a remote receiving MODEM is detected so that gain can be effectively controlled.

As is apparent from the aforementioned description according to the present invention, the transmitting signal level of the communication system via the public telephone line is controlled by detecting the transmitting signal level of remote MODEM received through said line, and thereby the gain attenuation according to the variation of the public telephone line condition can be automatically compensated.

While the invention has been particularly shown and described with reference to a preferred embodiment, it will be understood by those skilled in the art that modifications in detail may be made without departing from the spirit and scope of the invention.

What is claimed is:

1. An automatic compensation system for controlling the transmitting signal level in a MODEM for use in a public telephone line, comprising:
   first analog signal terminal means for receiving an analog input signal from a modulator of a MODEM;
   second analog signal terminal means for supplying an analog output signal to a modulator of the MODEM;
   transformer means having a first coil connectable to a public telephone line and a second coil coupled to the first coil, and providing impedance matching between said first and second coils, for transferring an analog signal from one coil to the other coil;
   gain controller means for providing an intermediate signal by controlling the output gain of an analog signal received from said first analog signal terminal means in accordance with gain control data;
   hybrid means coupled between said gain controller means, said second coil and said second analog signal terminal means, for amplifying the intermediate signal of said gain controller and then delivering a first amplified signal to the second coil to transmit to the telephone line, and for amplifying an output of said second coil received from the telephone line and then delivering a second amplified signal to said second analog signal terminal means;
   band-pass filter means having first and second band-pass filters for providing a first output signal by respectively separately filtering a first band signal and a second band signal from said second analog signal terminal means;
   amplifier means for providing a second output signal by amplifying the first output signal;
   voltage converter means for rectifying the second output signal of said amplifier to provide a rectified output signal;
   receiving level sensing means including therein a first and a second reference voltage node for each respectively receiving first and second reference voltages and each setting corresponding upper and lower limits on a received analog signal level, for providing a plurality of receiving information data by comparing the rectified output signal of said voltage converter means with said upper and lower limits, said receiving information data indicating the level of and initial control data.

2. The automatic compensation system according to claim 1, wherein said receiving level sensing means comprises:
   a first plurality of resistors connected in series between a source supplying voltage terminal and a first reference potential terminal to provide said first node,
   a second plurality of resistors connected in series between the source supplying voltage terminal and the a second reference potential terminal to provide said first node,
   a first comparator in which said first reference voltage and the output voltage of said voltage converter means are respectively applied to a non-inverting input and an inverting input for comparing the output voltage of said voltage converter means with the first reference voltage,
   a second comparator in which said second reference voltage and the output voltage of said voltage converter means are respectively applied to an inverting input and a non-inverting input for comparing the output voltage of said voltage converter means with the second reference voltage,
   a NOR gate receiving the outputs of said first and second comparators, and
   an inverter for inverting the output of said voltage converter means,
   whereby said receiving information data is applied to said microprocessor unit in accordance with the output of said voltage converter means and comparison of said output of said voltage converter means with the first and second reference voltages.

3. A method for automatically compensating the transmitting signal level of a MODEM, comprising the steps of:
   (a) setting an initial gain control data value for an initial transmission level, storing said data value, and outputting the data value to an output port;
   (b) judging whether input data is received by reading data reception information and data receiving level information;
   (c) selecting the data receiving level information when said step of judging indicates that input data is being received, and executing repeatedly said step of setting the initial gain control data value when said step of judging indicates that input data is not being received;
   (d) outputting the gain control data when the result of an analysis of the data receiving level information shows normal data receiving level information, and then working a determination at whether the data level of input data is high or low when the analysis shows abnormal data receiving level information; and
   (e) making an increment or decrement of the initial gain control data value to provide modified gain control data in value accordance with the determination made in said step (d) and then storing the modified gain control data value, and outputting the modified gain control data to the output port when a predetermined signal is received.

4. An automatic compensation system, comprising:
   first terminal means for receiving an analog input signal from a modulator of a MODEM;
   second terminal means for supplying an analog output signal to a modulator of the MODEM;

transformer means having a first coil connectable to a public telephone line and a second coil coupled to the first coil, and providing impedance matching between said first and second coils, for transferring an analog signal from one coil to the other coil;

gain control means for providing an intermediate signal by controlling output gain of an analog signal received from said first terminal means in accordance with gain control data;

means coupled between said gain control means, said second coil and said second terminal means, for amplifying the intermediate signal and then delivering a first amplified signal to the second coil to transmit to the telephone line, and for amplifying an output of said second coil received from the telephone line and then delivering a second amplified signal to said second terminal means;

filter means having a first and a second band-pass filter, for providing a first output signal by respectively separately filtering a first band signal and a second band signal from said second terminal means;

level sensing means, for providing receiving information data by comparing the first output signal with upper and lower reference signals, said receiving information data indicating a characteristic of the output of said second coil; and processor means for providing the gain control data to said gain controller in response to initial control data and the receiving information data.

5. The automatic compensation system of claim 4, wherein said level sensing means comprises:

a first plurality of resistors connectable in series between a source supplying voltage terminal and a first reference potential, a second plurality of resistors connectable in series between the source supplying voltage terminal and the a second reference potential, first comparator means coupled to receive a first reference voltage from said first plurality of resistors and the first output signal respectively applied to a non-inverting input and an inverting input, for comparing the first output signal with the first reference voltage, second comparator means coupled to receive a second reference voltage from said second plurality of resistors and the first output signal respectively applied to an inverting input and a non-inverting input, for comparing the first output signal with the second reference voltage, a NOR gate receiving the outputs of said first and second comparators, and inverting means for inverting the first output signal, whereby said receiving information data is applied to said processor means in accordance with said first output signal and a comparison of said first output signal with the first and second reference voltages.

6. The automatic compensation system of claim 4, wherein said level sensing means comprises:

first comparator means coupled to receive a first reference voltage and the first output signal respectively applied to a non-inverting input and an inverting input, for generating a first information receiving signal by comparing the first output signal with the first reference voltage, second comparator means coupled to receive a second reference voltage and the first output signal respectively applied to an inverting input and a non-inverting input, for generating a second receiving information signal by comparing the first output signal with the second reference voltage, logic means for generating a third receiving information signal on the basis of said first and second receiving information signals, and inverting means for inverting the first output signal to provide a fourth receiving information signal, whereby said first, second, third and fourth receiving information signals are applied to said processor means as said receiving information data.

7. The automatic compensation system of claim 4, wherein said amplifying means comprises:

a first amplifier stage having a non-inverting terminal coupled with a first resistance to receive said intermediate signal and an output terminal coupled with said first resistance to a first node;

a plurality of second resistances coupled in series between said first node and a reference potential;

a second amplifying stage having an inverting terminal coupled between said plurality of second resistances, a non-inverting terminal coupled with a third resistance, and an output terminal coupled with said third resistance to said second terminal means; and a plurality of fourth resistances coupled in series between said first node and said non-inverting terminal of said second amplifying stage, with said second coil coupled between said plurality of fourth resistances.

8. An automatic compensation system, comprising:

first terminal means for receiving an analog input signal from a modulator of a MODEM;

second terminal means for supplying an analog output signal to a modulator of the MODEM;

transformer means having a first coil connectable to a public telephone line and a second coil coupled to the first coil, and providing impedance matching between said first and second coils, for transferring an analog signal from one coil to the other coil;

gain control means for providing an intermediate signal by controlling output gain of an analog signal received from said first terminal means on the basis of gain control data and receiving information data;

means coupled between said gain control means, said second coil and said second terminal means, for amplifying the intermediate signal and then delivering a first amplified signal to the second coil to transmit to the telephone line, and for amplifying an output of said second coil received from the telephone line and then delivering a second amplified signal to said second terminal means;

filter means having a first and a second band-pass filter, for providing a first output signal by respectively separately filtering a first band signal and a second band signal from said second terminal means; and level sensing means, for providing said receiving information data by comparing said first output signal with upper and lower reference signals, said receiving information data indicating a characteristic of the output of said second coil.

9. The automatic compensation system of claim 8, wherein said level sensing means comprises:

a first plurality of resistors connectable in series between a source supplying voltage terminal and a first reference terminal, a second plurality of resistors connectable in series between the source supplying voltage terminal and the a second reference potential, first comparator means coupled to receive a first reference voltage from said first plurality of resistors and the first output signal respectively applied to a non-inverting input and an inverting input, for comparing the first output signal with the first reference voltage, second comparator means coupled to receive a second reference voltage from said second plurality of resistors and the first output signal respectively applied to an inverting input and a non-inverting input, for comparing the first output signal with the second reference voltage, a NOR gate receiving the outputs of said first and second comparators, and inverting means for inverting the first output signal, whereby said receiving information data is applied to said gain control means in accordance with said first output signal and a comparison of said first output signal with the first and second reference voltages.

10. The automatic compensation system of claim 8, wherein said level sensing means comprises:

first comparator means coupled to receive a first reference voltage and the first output signal respectively applied to a non-inverting input and an inverting input, for generating a first information receiving signal by comparing the first output signal with the first reference voltage, second comparator means coupled to receive a second reference voltage and the first output signal respectively applied to an inverting input and a non-inverting input, for generating a second receiving information signal by comparing the first output signal with the second reference voltage, logic means for generating a third receiving information signal on the basis of said first and second receiving information signals, and inverting means for inverting the first output signal to provide a fourth receiving information signal, whereby said first, second, third and fourth receiving information signals are applied to said gain control means as said receiving information data.

11. The automatic compensation system of claim 8, wherein said amplifying means comprises:

a first amplifier stage having a non-inverting terminal coupled with a first resistance to receive said intermediate signal and an output terminal coupled with said first resistance to a first node;

a plurality of second resistances coupled in series between said first node and a reference potential;

a second amplifying stage having an inverting terminal coupled between said plurality of second resistances, a non-inverting terminal coupled with a third resistance, and an output terminal coupled with said third resistance to said second terminal means; and a plurality of fourth resistances coupled in series between said first node and said non-inverting terminal of said second amplifying stage, with said second coil coupled between said plurality of fourth resistances.

12. An automatic compensation system, comprising:

first terminal means for receiving an analog input signal from a modulator of a MODEM;

second terminal means for supplying an analog output signal to a modulator of the MODEM;

transformer means having a first coil connectable to a public telephone line and a second coil coupled to the first coil, and providing impedance matching between said first and second coils, for transferring an analog signal from one coil to the other coil;

gain control means for providing an intermediate signal by controlling output gain of an analog signal received from said first terminal means on the basis of gain control data and receiving information data;

means coupled between said gain control means, said second coil and said second terminal means, for amplifying the intermediate signal and then delivering a first amplified signal to the second coil to transmit to the telephone line, and for amplifying an output of said second coil received from the telephone line and then delivering a second amplified signal to said second terminal means;

level sensing means, for providing said receiving information data by comparing a signal from said second terminal means with upper and lower reference signals, said receiving information data indicating a characteristic of the output of said second coil.

13. The automatic compensation system of claim 12, wherein said level sensing means comprises:

a first plurality of resistors connectable in series between a source supplying voltage terminal and a first reference potential, a second plurality of resistors connectable in series between the source supplying voltage terminal and the a second reference potential, first comparator means coupled to receive a first reference voltage from said first plurality of resistors and the signal from said second terminal means respectively applied to a non-inverting input and an inverting input, for comparing the signal from said second terminal means with the first reference voltage, second comparator means coupled to receive a second reference voltage from said second plurality of resistors and said signal from said second terminal means respectively applied to an inverting input and a non-inverting input, for comparing the signal from said second terminal means with the second reference voltage, a NOR gate receiving the outputs of said first and second comparators, and inverting means for inverting the signal from said second terminal means, whereby said receiving information data is applied to said gain control means in accordance with said signal from said second terminal means and a comparison of said signal from said second terminal means with the first and second reference voltages.

14. The automatic compensation system of claim 12, wherein said level sensing means comprises:

first comparator means coupled to receive a first reference voltage and a signal from said second terminal means respectively applied to a non-inverting input and an inverting input, for generating a first information receiving signal by comparing the signal from said second terminal means with the first reference voltage, second comparator means coupled to receive a second reference voltage and the signal from said second terminal means respectively applied to an inverting input and a non-inverting input, for generating a second receiving information signal by comparing the signal from said second terminal means with the second reference voltage, logic means for generating a third receiving information signal on the basis of said first and second receiving information signals, and inverting means for inverting the signal from said second terminal means to provide a fourth receiving information signal, whereby said first, second, third and fourth receiving information signals are applied to said gain control means as said receiving information data.

15. The automatic compensation system of claim 12, wherein said amplifying means comprises:

a first amplifier stage having a non-inverting terminal coupled with a first resistance to receive said intermediate signal and an output terminal coupled with said first resistance to a first node;

a plurality of second resistances coupled in series between said first node and a reference potential;

a second amplifying stage having an inverting terminal coupled between said plurality of second resistances, a non-inverting terminal coupled with a third resistance, and an output terminal coupled with said third resistance to said second terminal means; and a plurality of fourth resistances coupled in series between said first node and said non-inverting terminal of said second amplifying stage, with said second coil coupled between said plurality of fourth resistances.

16. An automatic compensation system, comprising:

first terminal means for receiving an analog input signal from a modulator of a MODEM;

second terminal means for supplying an analog output signal to a modulator of the MODEM;

means having a first stage connectable to a public telephone line and a second stage coupled to the first stage, and providing impedance matching between said first and second stages, for transferring an analog signal from one of said first and second stages to the other of said first and second stages;

gain control means for providing an intermediate signal by controlling output gain of an analog signal received from said first terminal means on the basis of gain control data and receiving information data;

means coupled between said gain control means, said second stage and said second terminal means, for amplifying the intermediate signal and then delivering a first amplified signal to the second stage to transmit to the telephone line, and for amplifying an output of said second stage received from the telephone line and then delivering a second amplified signal to said second terminal means;

level sensing means, for providing said receiving information data by comparing a signal from said second terminal means with upper and lower reference signals, said receiving information data indicating a characteristic of the output of said second stage.

17. The automatic compensation system of claim 16, wherein said level sensing means comprises:

a first plurality of resistors connectable in series between a source supplying voltage terminal and a first reference potential, a second plurality of resistors connectable in series between the source supplying voltage terminal and the a second reference potential, first comparator means coupled to receive a first reference voltage from said first plurality of resistors and the signal from said second terminal means respectively applied to a non-inverting input and an inverting input, for comparing the signal from said second terminal means with the first reference voltage, second comparator means coupled to receive a second reference voltage from said second plurality of resistors and said signal from said second terminal means respectively applied to an inverting input and a non-inverting input, for comparing the signal from said second terminal means with the second reference voltage, a NOR gate receiving the outputs of said first and second comparators, and inverting means for inverting the signal from said second terminal means, whereby said receiving information data is applied to said gain control means in accordance with said signal from said second terminal means and a comparison of said signal from said second terminal means with the first and second reference voltages.

18. The automatic compensation system of claim 16, wherein said level sensing means comprises:

first comparator means coupled to receive a first reference voltage and a signal from said second terminal means respectively applied to a non-inverting input and an inverting input, for generating a first information receiving signal by comparing the signal from said second terminal means with the first reference voltage, second comparator means coupled to receive a second reference voltage and the signal from said second terminal means respectively applied to an inverting input and a non-inverting input, for generating a second receiving information signal by comparing the signal from said second terminal means with the second reference voltage, logic means for generating a third receiving information signal on the basis of said first and second receiving information signals, and inverting means for inverting the signal from said second terminal means to provide a fourth receiving information signal, whereby said first, second, third and fourth receiving information signals are applied to said gain control means as said receiving information data.

19. The automatic compensation system of claim 16, wherein said amplifying means comprises:

a first amplifying section having a non-inverting terminal coupled with a first resistance to receive said intermediate signal and an output terminal coupled in common with said first resistance to a first node;

a plurality of second resistances coupled in series between said first node and a reference potential;

a second amplifying section having an inverting terminal coupled between said plurality of second resistances, a non-inverting terminal coupled to with a third resistance, and an output terminal coupled with said third resistance to said second terminal means; and a plurality of fourth resistances coupled in series between said first node and said non-inverting terminal of said second amplifying section, with said second stage coupled between said plurality of fourth resistances.

20. An automatic compensation system, comprising:

first terminal means for receiving an analog input signal from a modulator of a MODEM;

second terminal means for supplying an analog output signal to a modulator of the MODEM;

means having a first stage connectable to a public telephone line and a second stage coupled to the first stage, and providing impedance matching between said first and second stages, for transferring an analog signal from one of said first and second stages to the other of said first and second stages;

gain control means for providing an intermediate signal by controlling output gain of an analog signal received from said first terminal means on the basis of gain control data and receiving information data;

a first amplifying section having a non-inverting terminal coupled with a first resistance to receive said intermediate signal and an output terminal coupled with said first resistance to a first node;

a plurality of second resistances coupled in series between said first node and a reference potential;

a second amplifying section having an inverting terminal coupled between said plurality of second resistances, a non-inverting terminal coupled with a third resistance, and an output terminal coupled with said third resistance to said second terminal means;

a plurality of fourth resistances coupled in series between said first node and said non-inverting terminal of said second amplifying section, with said second stage coupled between said plurality of fourth resistances;

first comparator means coupled to receive a first reference voltage and an analog signal from said second terminal means respectively applied to a non-inverting input and an inverting input, for generating a first information receiving signal by comparing the analog signal from said second terminal means with the first reference voltage, second comparator means coupled to receive a second reference voltage and the analog signal from said second terminal means respectively applied to an inverting input and a noninverting input, for generating a second receiving information signal by comparing the signal from said second terminal means with the second reference voltage, logic means for generating a third receiving information signal on the basis of said first and second receiving information signals, and inverting means for inverting the signal from said second terminal means to provide a fourth receiving information signal, whereby said first, second, third and fourth receiving information signals are applied to said gain control means as said receiving information data.

* * * * *